(12) United States Patent
Yamada et al.

(10) Patent No.: US 6,975,065 B2
(45) Date of Patent: Dec. 13, 2005

(54) LIGHT-EMITTING DEVICE AND LIGHT-EMITTING DEVICE MANUFACTURING METHOD

(75) Inventors: Tsutomu Yamada, Gifu (JP); Ryuji Nishikawa, Gifu (JP)

(73) Assignee: Sanyo Electric Co., Ltd., (JP)

( * ) Notice: Subject to any disclaimer, the term of this patent is extended or adjusted under 35 U.S.C. 154(b) by 0 days.

(21) Appl. No.: 10/109,170

(22) Filed: Mar. 27, 2002

(65) Prior Publication Data

US 2002/0158576 A1    Oct. 31, 2002

(30) Foreign Application Priority Data

Mar. 30, 2001    (JP)    ............... 2001-102390

(51) Int. Cl.$^7$ ............................. H01J 1/62
(52) U.S. Cl. ................ 313/504; 313/505; 313/503; 445/24; 427/66
(58) Field of Search ............... 313/498–512, 313/582; 427/66; 428/690, 917; 445/24, 445/25; 257/79, E51.001

(56) References Cited

U.S. PATENT DOCUMENTS

| | | | |
|---|---|---|---|
| 5,688,551 A * | 11/1997 | Littman et al. ............ | 427/64 |
| 5,825,128 A * | 10/1998 | Betsui et al. ............. | 313/582 |
| 5,952,037 A * | 9/1999 | Nagayama et al. ......... | 427/66 |
| 5,966,189 A * | 10/1999 | Matsuo ..................... | 349/38 |
| 6,417,034 B2 * | 7/2002 | Kitazume et al. .......... | 438/160 |
| 6,479,930 B1 * | 11/2002 | Tanabe et al. ............ | 313/509 |
| 6,627,332 B2 * | 9/2003 | Utsugi et al. ............. | 428/690 |
| 6,628,067 B2 * | 9/2003 | Kobayashi et al. ........ | 313/504 |
| 6,696,105 B2 * | 2/2004 | Hiroki et al. ............. | 427/466 |
| 2002/0109457 A1 * | 8/2002 | Duineveld et al. ........ | 313/504 |

FOREIGN PATENT DOCUMENTS

| | | |
|---|---|---|
| EP | 1 093 167 A2 | 4/2001 |
| KR | 2001-0050933 | 6/2001 |

OTHER PUBLICATIONS

Notice to Submit Argument, Korean Office Action, Application No. 10-2002-0017323, dated Apr. 21, 2004.

* cited by examiner

Primary Examiner—Karabi Guharay
Assistant Examiner—German Colón
(74) Attorney, Agent, or Firm—Cantor Colburn LLP

(57) ABSTRACT

An organic EL display in which the film thickness of an organic emissive layer is made uniform so as to increase the effective light emission area. An anode and a common cathode are formed for each pixel on the organic EL display. Switching by thin-film transistors causes current to flow between the anode and the cathode so that the organic EL element emits light. The organic EL element comprises a hole transport layer, the organic emissive layer, and an electron transport layer. Among a plurality of pixels disposed in a matrix configuration, the organic emissive layer is formed in common with adjacent pixels of the same color. Forming the organic emissive layer in common can prevent a decrease in the film thickness of the organic emissive layer at the edges of the shadow mask during vapor deposition and result in a uniform film thickness of the organic emissive layer.

9 Claims, 11 Drawing Sheets

LIGHT-EMITTING DEVICE AND LIGHT-EMITTING DEVICE MANUFACTURING METHOD

BACKGROUND OF THE INVENTION

1. Field of the Invention

The present invention relates to a light-emitting device, and more particularly to increasing the effective light emission area.

2. Description of the Related Art

Flat display panels are recently known to use organic electroluminescence (organic EL) elements. Organic EL elements are self emitting displays in which an electrical current is supplied to an organic EL layer, provided between an anode and a cathode, causing the organic EL layer to emit light. Also since a backlight is unnecessary, unlike LCDs, organic EL elements are expected to be the next major type of flat display panel. In particular, in the active matrix type of organic EL display in which a switching element is formed at each pixel, a larger and higher resolution screen is possible since display data can be stored at each respective pixel.

In this sort of organic EL display, the organic EL layer, which is an emissive layer, is usually formed by a vacuum evaporation process using a shadow mask on a circuit substrate.

FIG. 6 shows a typical pixel arrangement of a color organic EL display 1. The organic EL display 1 comprises a plurality of pixels 1a arranged in a matrix configuration. Each pixel 1a has a switching element, such as a thin-film transistor, and the switching element of each pixel is driven by a gate line corresponding to the row and a data line corresponding to a column so as to cause the organic EL element to emit light. Although the arrangement of the R pixels, the G pixels, and the B pixels is arbitrary, the R pixels, the G pixels, and the B pixels may be positioned linearly (stripe arrangement in columns) as shown in the figure, for example.

FIG. 7 is a detailed top view of the pixel 1a of FIG. 6. FIGS. 8A and 8B respectively show the cross-sectional views of A—A and B—B of FIG. 7. In both figures, the area enclosed by a gate line 51 extending in the row direction and a data line 52 extending in the column direction represents one pixel area 1a. Within this area are formed an n-channel thin-film transistor 13, a storage capacitor 70, and a p-channel thin-film transistor 42. An organic EL element 65, which is connected via a drain electrode 43d to the thin-film transistor 42, is further provided. Furthermore, a source of the thin-film transistor 42 is connected to a power line 53 via a source electrode 43s.

An active layer 9 of the thin-film transistor 13 forms a pattern of a double-gate structure that passes twice underneath gate electrodes 11 protruding from the gate line 51. A drain of the thin-film transistor 13 is connected to the data line 52 via a drain electrode 16 and a source is connected to a gate 41 of the thin-film transistor 42 via the storage capacitor 70 and a bridge structure. The storage capacitor 70 is formed from an electrode 55 integrated with the active layer 9 and an SC line 54 connected to power Vsc.

As described in the foregoing, the drain of the thin-film transistor 42 is connected to an organic EL element 60. The organic EL element 60 is comprised from an anode (transparent electrode) 61 that is formed at each pixel on a planarization insulating film 17 on the thin-film transistors 13, 42, a cathode (metal electrode) 66 that is formed in common with the pixels on the topmost layer, and an organic layer 65 that is laminated between the anode 61 and the cathode 66. The anode 61 is comprised from a material such as ITO and is connected via the drain electrode 43d to the thin-film transistor 42. Furthermore, the organic layer 65 is comprised by sequentially laminating from the anode 61, a hole transport layer 62, an organic emissive layer 63, and an electron transport layer 64. Although the organic emissive layer 63 is composed of a different material for the R pixels, the G pixels, and the B pixels, a material containing $BeBq_2$ that includes a Quinacridon derivative is used.

The above-mentioned components of each pixel are all laminated on a substrate 3. Namely, an insulating layer 4 is formed on the substrate 3, and thereon a semiconductor layer 9 is formed as a pattern. Gates 11, 41 are then formed via a gate oxidizing film 12 on the semiconductor 9. An interlayer insulating film 15 is formed on gates 11, 41, and the active layer 9, such as of poly-silicon, is connected to the anode 61 via a contact hole that is formed in the interlayer insulating film 15.

Furthermore, to form the organic EL element 60 on the transparent anode 61 that is formed at each pixel, the organic emissive layer 63 may be evaporated for each of the R pixels, G pixels, and B pixels using a shadow mask 2 having an opening 2a corresponding to each pixel as shown in FIG. 9. Since a current is mainly supplied to the region sandwiched by the anode 61 and the cathode 66, the organic emissive layer 63 is positioned then formed on the anode 61.

In this configuration, when a selection signal is output to the gate line 51, the thin-film transistor 13 turns on and the storage capacitor 70 is charged in accordance with the voltage value of the data signal that is impressed on the data line 52 at the time. The gate of the thin-film transistor 42 receives a voltage corresponding to the charge stored in the storage capacitor 70. This controls the current that is supplied to the organic EL element from the power line 53 so that the organic EL element emits light at an intensity that corresponds to the supplied current.

However, when the organic emissive layer 63 is formed by vacuum evaporation using the mask 2 provided with openings 2a corresponding to the pixels as shown in FIG. 9, the thickness of the organic emissive layer 63 becomes uneven due to the shadowing effect at the edges of the opening 2a, resulting in a problem where uniform emission characteristics can not be obtained.

FIG. 10 shows a partial enlarged view of the mask 2. The opening 2a of the mask 2 is formed to match the shape of the anode 61 so as to be positioned on the anode 61 of each pixel as described in the foregoing, and allows the evaporated organic luminescence material to pass through from a evaporation source that is secured to a predetermined position. The film thickness of the organic emissive layer 63 along the z direction in the figure is approximately uniform at a center 100 as shown in FIG. 11 and the film thickness at edges 102 of the opening 2a is less than the center due to the shadowing effect. This sort of unevenness in film thickness may result in a problem of uneven light emission or a decrease in the effective light emission area.

SUMMARY OF THE INVENTION

The object of the present invention is to increase the effective light emission area during light emission at each pixel in a light-emitting device, such as of an organic EL display.

The light-emitting device of the present invention comprises a first electrode, a second electrode, and an emissive layer formed between the first electrode and the second electrode. At least either the first electrode or the second electrode is formed at each pixel and the emissive layer is in common with a plurality of pixels in adjacency in a matrix. When the pixel is a color pixel, the emissive layer is in common with a plurality of pixels of the same color in adjacency. For example, when a pixel is composed from an R pixel, a G pixel, and a B pixel, the emissive layer is in common with adjacent R pixels, G pixels, or B pixels. An organic electroluminescence material, for example, is used for the emissive layer.

Forming the emissive layer in common or integrally with adjacent pixels instead of at each pixel obviates the use of a mask having an opening corresponding to each pixel and eliminates the shadowing effect that develops at the edges of the openings so that the film thickness of the emissive layer can be made uniform. Making a uniform film thickness of the emissive layer results in the flow of a uniform current in the emissive layer, thereby increasing the effective light emission area.

With the first electrode an anode and the second electrode a cathode, for example, at least either the first electrode or the second electrode is formed at each pixel. Therefore, even though the emissive layer is in common with a plurality of pixels in adjacency, the flow of the current is actually in the portion sandwiched by the first electrode and the second electrode so that the light emission can be controlled at each pixel.

Furthermore, the present invention provides a method for manufacturing the light-emitting device. This method includes the steps of (a) forming the first electrode on a substrate, (b) forming the emissive layer on the first electrode using a mask having an opening, and (c) forming the second electrode on the emissive layer. At least either the first electrode or the second electrode is formed at each pixel, and the emissive layer in step (b) is integrally formed with a plurality of pixels in adjacency by the same opening in the mask.

A mask using this manufacturing method has an opening that is in common with a plurality of pixels in adjacency. When the pixel is a color pixel, the opening is in common with a plurality of pixels of the same color in adjacency. When the pixel is composed from an R pixel, a G pixel, and a B pixel, the opening is in common with R pixels, with G pixels, or with B pixels. The emissive layer for the R pixels is formed using a mask having a common opening for the R pixels, the emissive layer for the G pixels is formed using a mask having a common opening for the G pixels, and the emissive layer for the B pixels is formed using a mask having a common opening for the B pixels.

As described in the foregoing, the film thickness of the emissive layer according to the present invention can be made uniform by forming a common emissive layer. As a result, uneven light emission can be suppressed and the effective light emission area can be increased.

DETAILED DESCRIPTION OF THE PREFERRED EMBODIMENTS

The embodiments of the present invention will be described hereinafter with reference to the drawings while taking an organic EL display as an example.

Figure 1:
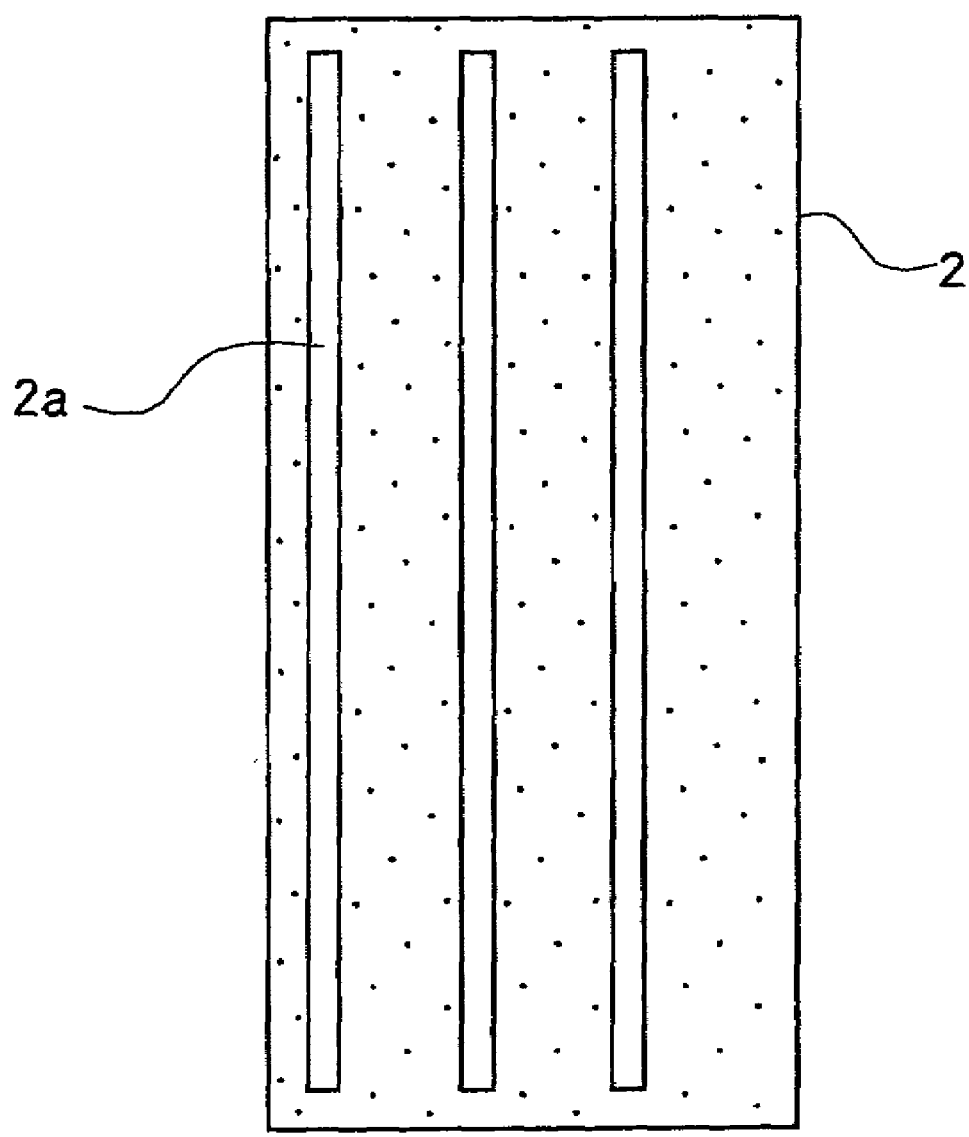
FIG. 1 is a top view of a mask of an embodiment.
Figure 9:
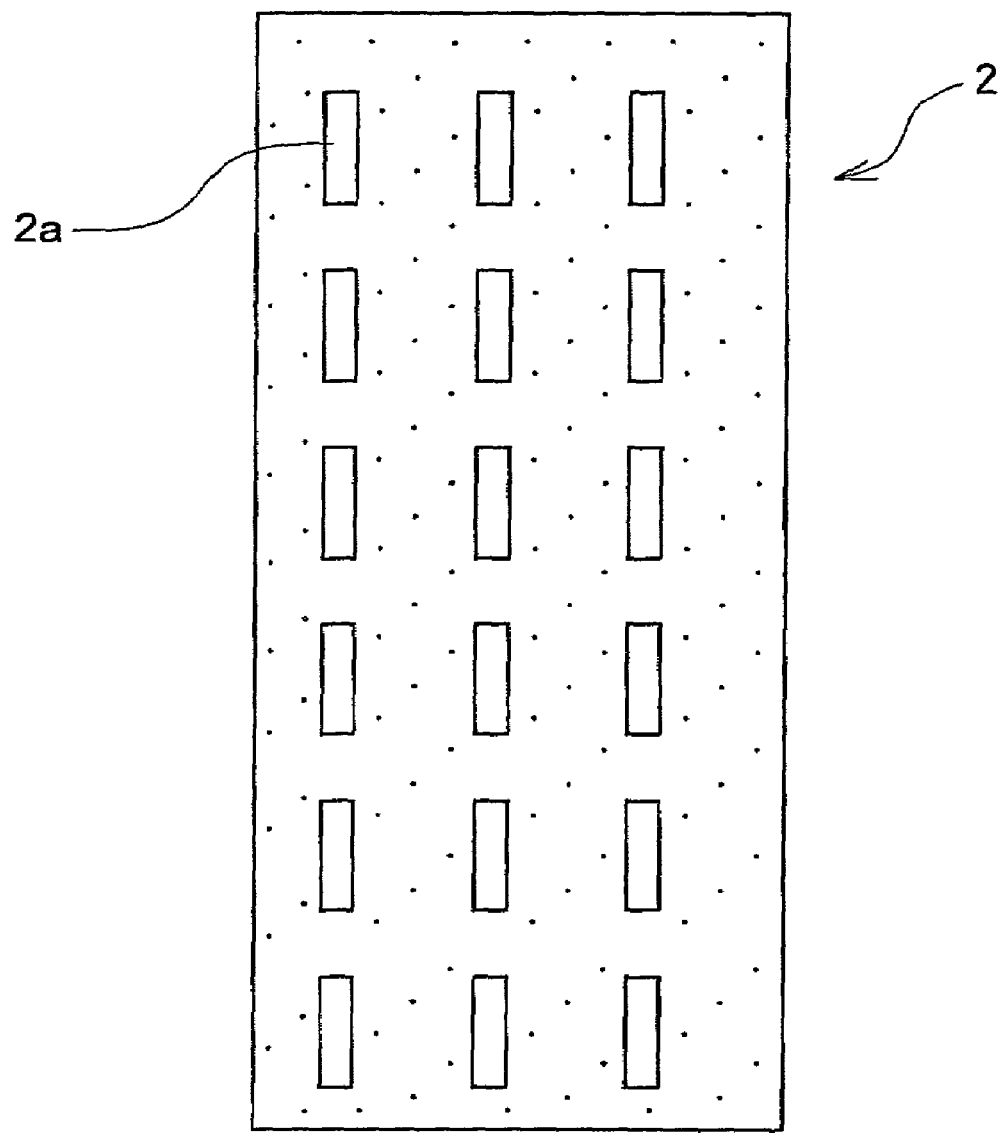
FIG. 9 illustrates a conventional mask.
Figure 10:
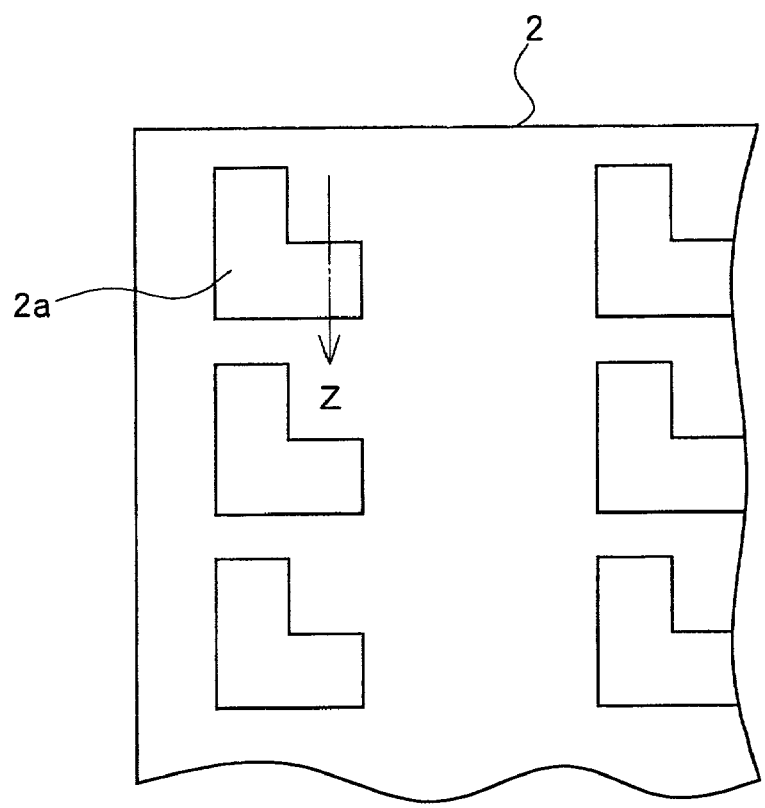
FIG. 10 is a partial enlarged view of a conventional mask.
Figure 11:
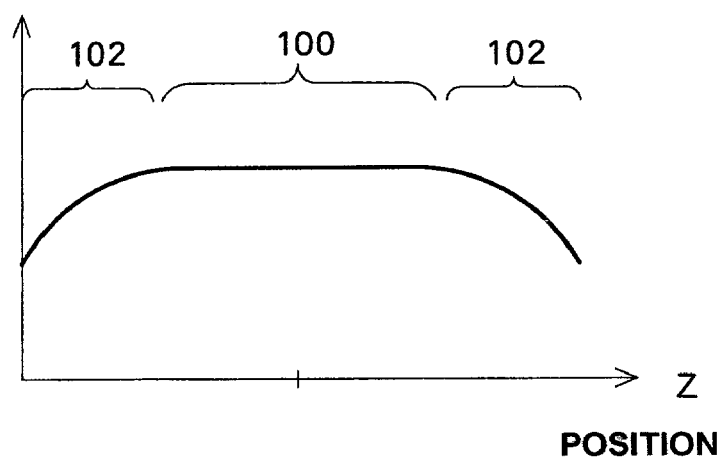
FIG. 11 illustrates a film thickness distribution of a conventional organic emissive layer.

FIG. 1 shows a configuration of the shadow mask 2 for the formation of the organic emissive layer 63 relating to the present embodiment. In the conventional mask shown in FIG. 9 are discrete openings 2a corresponding to the respective pixels. In the present embodiment are openings 2a that are in common among adjacent pixels. More specifically, for a particular color, the R pixels, for example, the R pixel group is arranged linearly in a column. The opening 2a for forming the R pixels is also arranged linearly in a column so that the opening 2a is in common among adjacent pixels. This yields the opening 2a as a stripe shape as shown in the figure. The width of the opening 2a corresponds to the width of one pixel and the length is determined according to the number of pixels to be in common. Namely, if the organic emissive layer 63 is to be in common for two adjacent pixels, the length becomes the pixel length×2. If the organic emissive layer 63 is to be in common for n adjacent pixels (n=2, 3, . . . ), the length becomes the pixel length×n. In the figure, with k denoting the total number of pixels in the column, the length of the organic emissive layer 63 in common with all the pixels arranged in the column is the pixel length×k. The pitch of the stripe shape opening 2a is equivalent to the pitch of the same color pixels in the row. The mask 2 has the same conventional thickness of 50 μm. The mask for the G pixels and the mask for the B pixels have a similar configuration and the opening 2a can be formed in a stripe shape.

Figure 12:
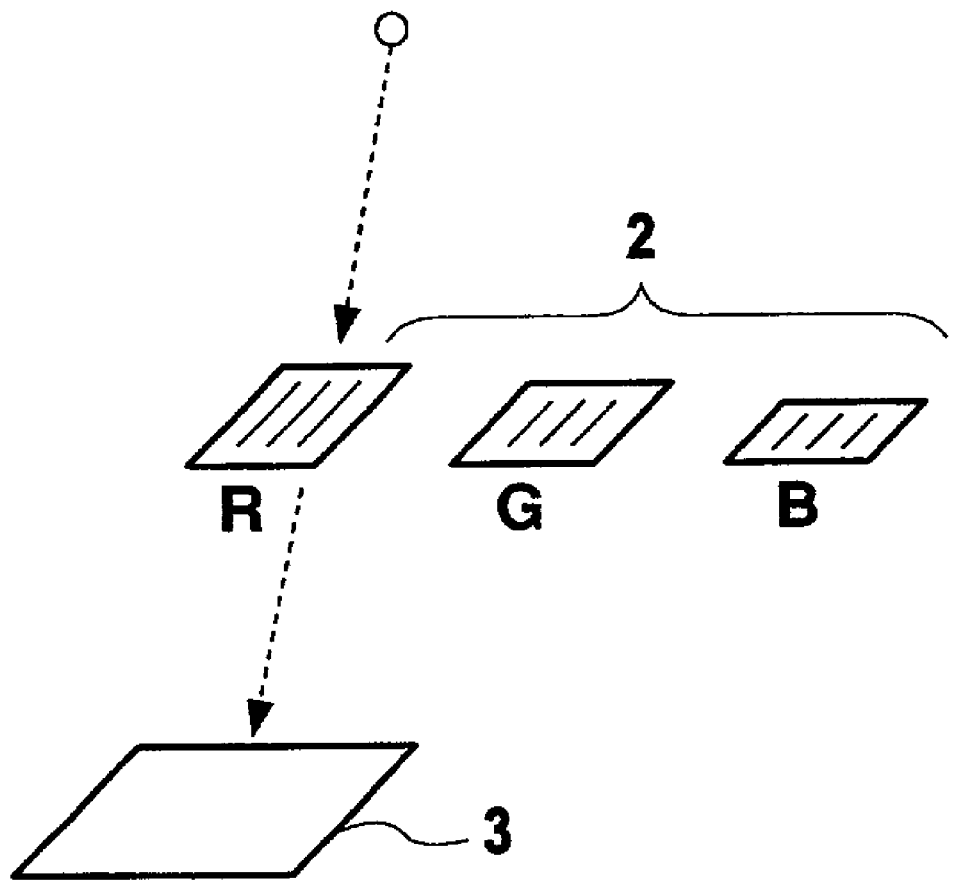
FIG. 12 illustrates the formation of the R pixels, the G pixels, and the B pixels.

By using the mask 2 for R, for G, and for B and sequentially vapor depositing the organic EL material as shown in FIG. 12, the organic emissive layer 63 for the R pixels, the organic emissive layer 63 for the G pixels, and the organic emissive layer 63 for the B pixels are respectively formed on the substrate 3. The evaporation source is usually positioned below the substrate 3, and the mask 2 is positioned between the evaporation source and the substrate 3 (bottom surface of the substrate).

Figure 2:
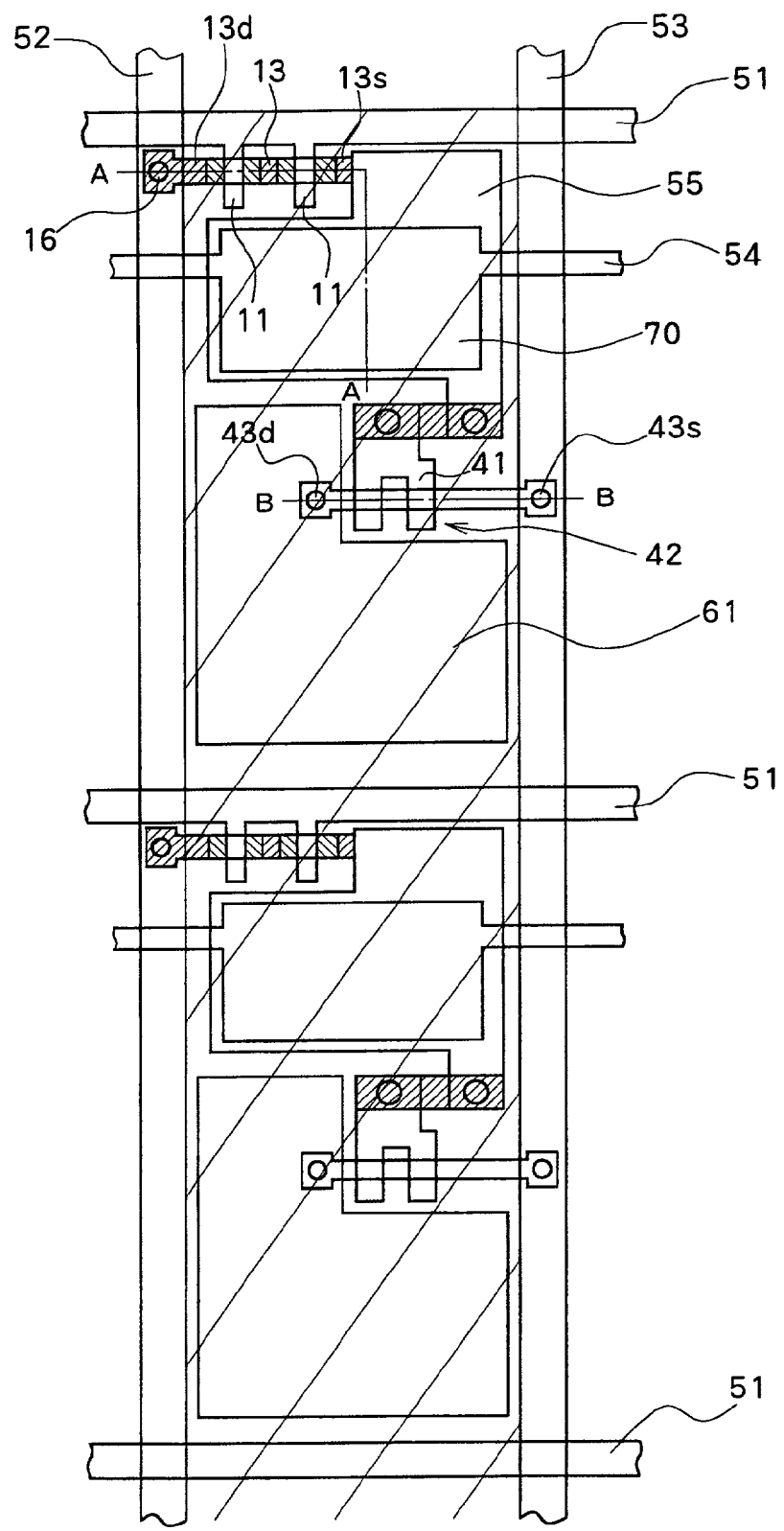
FIG. 2 is a top view of a semiconductor apparatus of an embodiment.
Figure 3A:
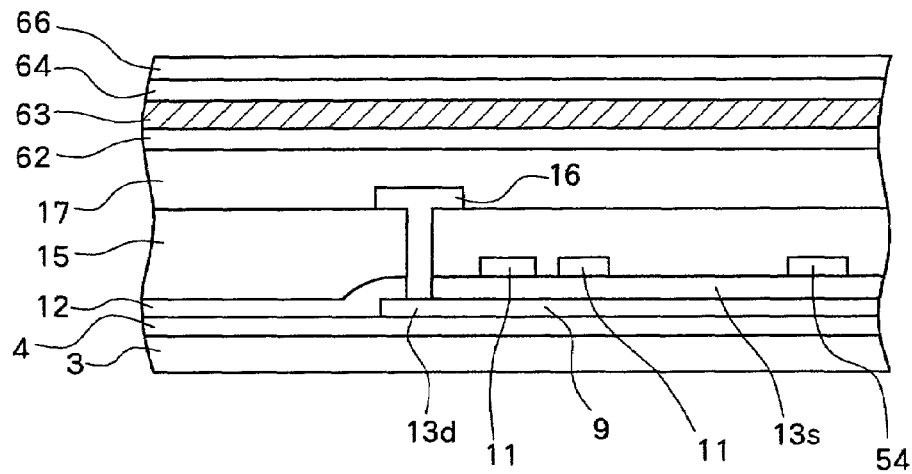
FIG. 3A is a cross-sectional view of A—A of FIG. 2
Figure 3B:
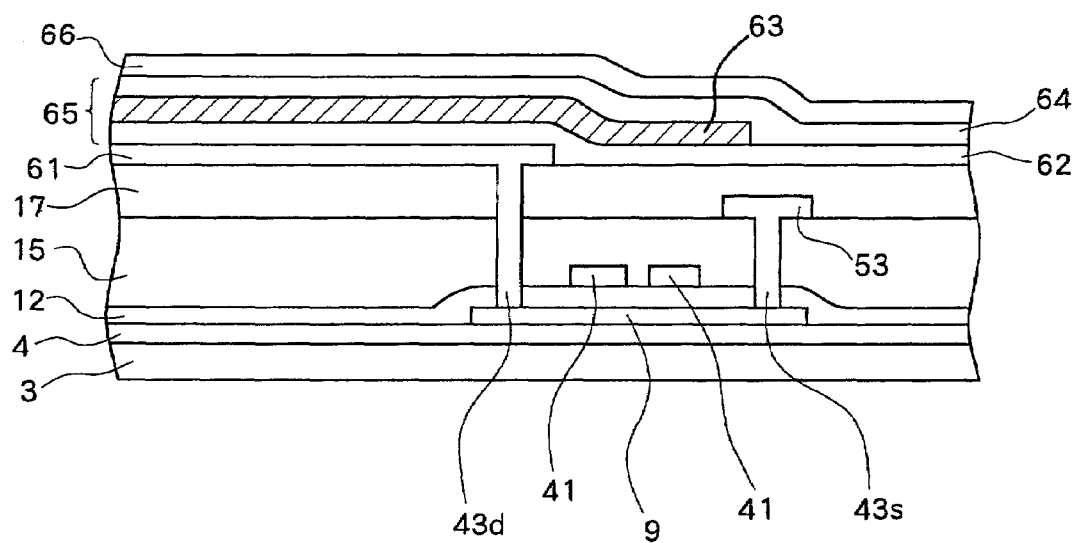
FIG. 3B is a cross-sectional view of B—B.

FIG. 2 is a top view of the organic EL display when the organic emissive layer 63 is formed using the mask 2 shown in FIG. 1. FIGS. 3A and 3B respectively show the cross-sectional views of A—A and B—B in FIG. 2. It should be noted that two adjacent pixels of the same color are shown in a column for the convenience of illustration.

Figure 7:
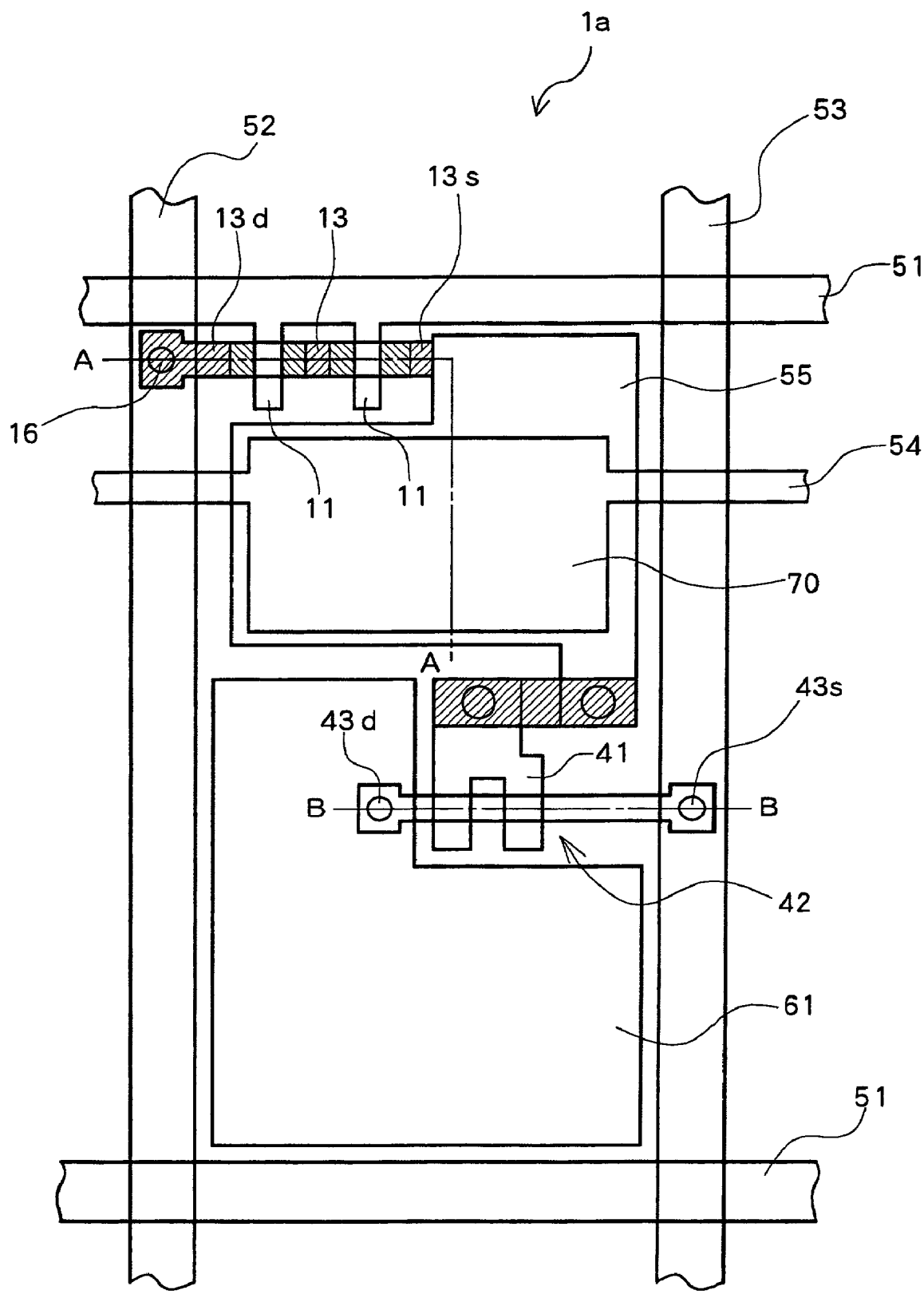
FIG. 7 is a top view of a conventional semiconductor apparatus.
Figure 8A:
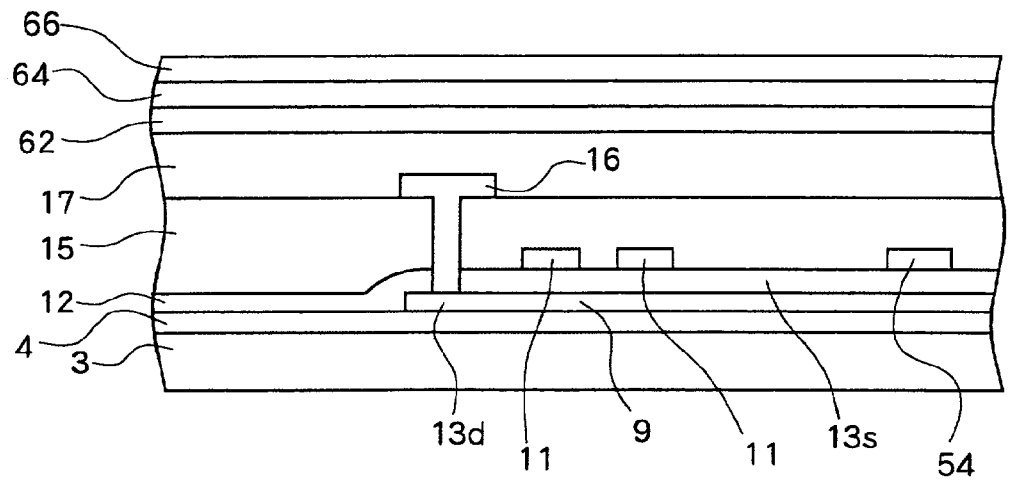
FIG. 8A is a cross-sectional view of A—A of FIG. 7
Figure 8B:
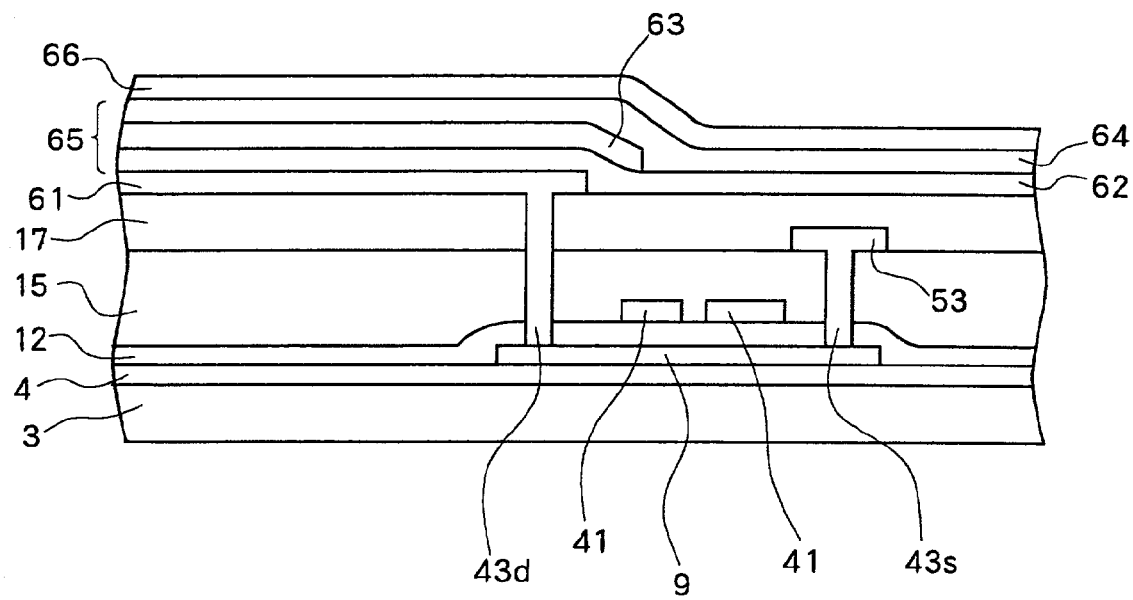
FIG. 8B is a cross-sectional view of B—B.

The configuration of each pixel is substantially similar to that shown in FIG. 7. In one pixel are formed the thin-film transistors 13, 42 and the storage capacitor 70. The drain of the thin-film transistor 13 is connected to the data line 52, the source of the thin-film transistor 13 is connected to one electrode of the storage capacitor 70 and to the gate of the thin-film transistor 42, and the gate of the thin-film transistor 13 is connected to the gate line 51. Furthermore, the source of the thin-film transistor 42 is connected to the power line 53 and the drain is connected to the transparent anode 61.

When forming the organic EL element 65 on the anode 61 in the present embodiment, the mask 2 having the stripe-shaped openings 2a as shown in FIG. 1 is used so that the organic emissive layer 63 is formed not only on the electrode of one pixel, namely, the anode 61 individually formed as an electrode for each pixel, but integrally on all the adjacent pixels in the column, or more specifically, the column region sandwiched by the data line 52 and the power line 53. In FIG. 2, the formed region of the organic emissive layer 63 is shown shaded for convenience. It is formed not only on the anode 61 of one pixel but also on the thin-film transistors 13, 42, the storage capacitor 70, and the gate line 51. Therefore, the organic emissive layer 63 is formed in a similar manner as the hole transport layer 62, the electron transport layer 64, and the cathode 66 in FIG. 3A, and the organic emissive layer 63 extends near a source electrode 43s of the thin-film transistor 42 in FIG. 3B.

Figure 4:
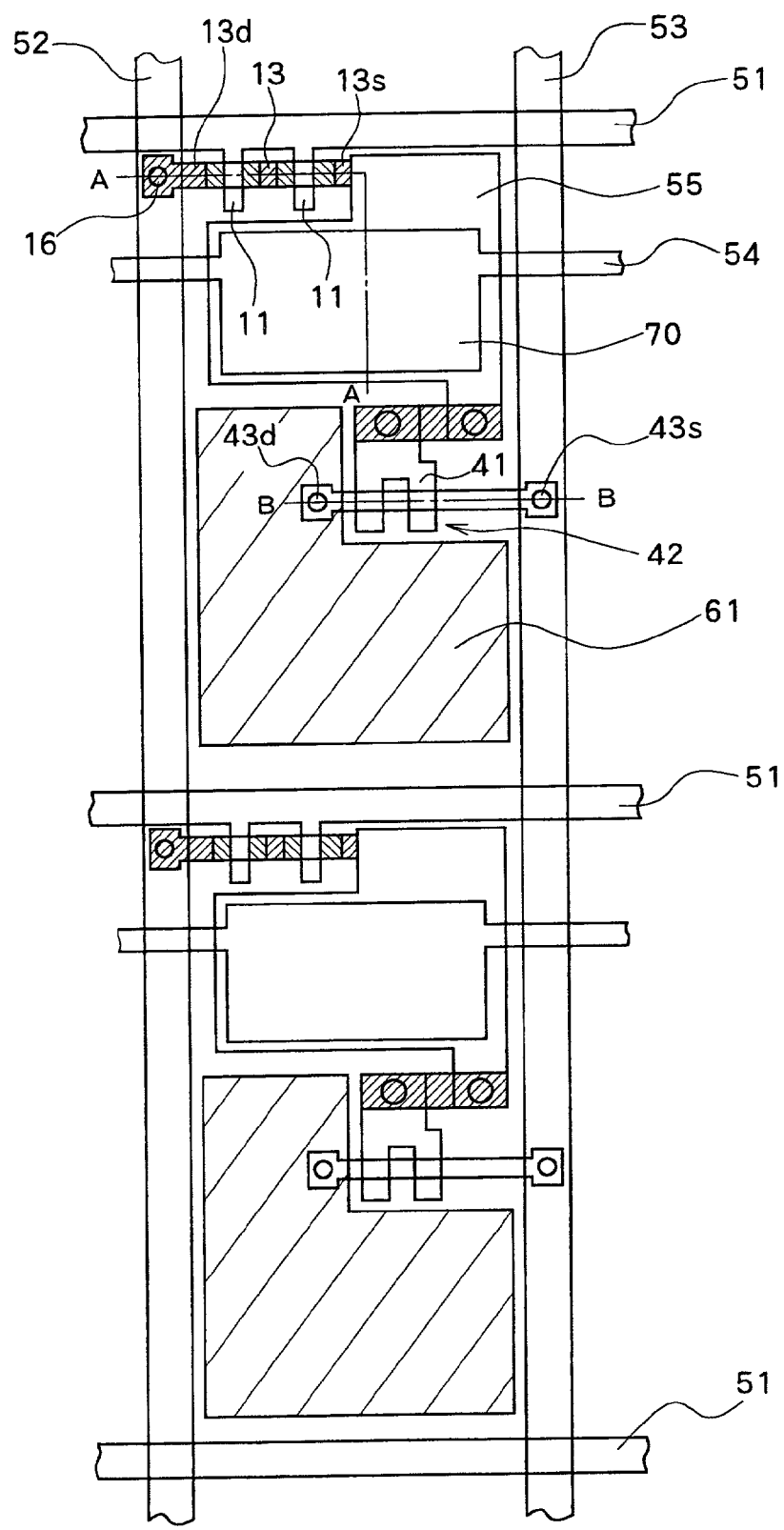
FIG. 4 is a top view of a conventional semiconductor apparatus.

For reference, the conventional formed region of the organic emissive layer 63 is shown shaded in FIG. 4. The organic emissive layer 63 is formed only on the anode 61 of one pixel, which clearly differs from the present embodiment.

Thus, in the present embodiment, the opening 2a of the mask 2 has a striped shape and the organic emissive layer 63 is in common with adjacent pixels of the same color so that the edges of the opening 2a are not on a boundary of adjacent pixels or a boundary of the anode 61. Therefore, in the case where the organic emissive layer 63 is formed by evaporation, the shadowing effect at the edges disappears, and the film thickness of the organic emissive layer 63 can be made uniform along the column.

In the present embodiment, the organic emissive layer 63 is formed also on the thin-film transistors 13, 42 and the storage capacitor 70. However, since the organic emissive layer 63 has a high resistivity, current flows only through the part sandwiched by the anode 61 and the cathode 66 so that light emission occurs only on the anode 61. Namely, light emission occurs at each pixel.

Although the embodiment of the present invention was described in the above, the present invention is not limited thereto and various modifications are possible.

Figure 5:
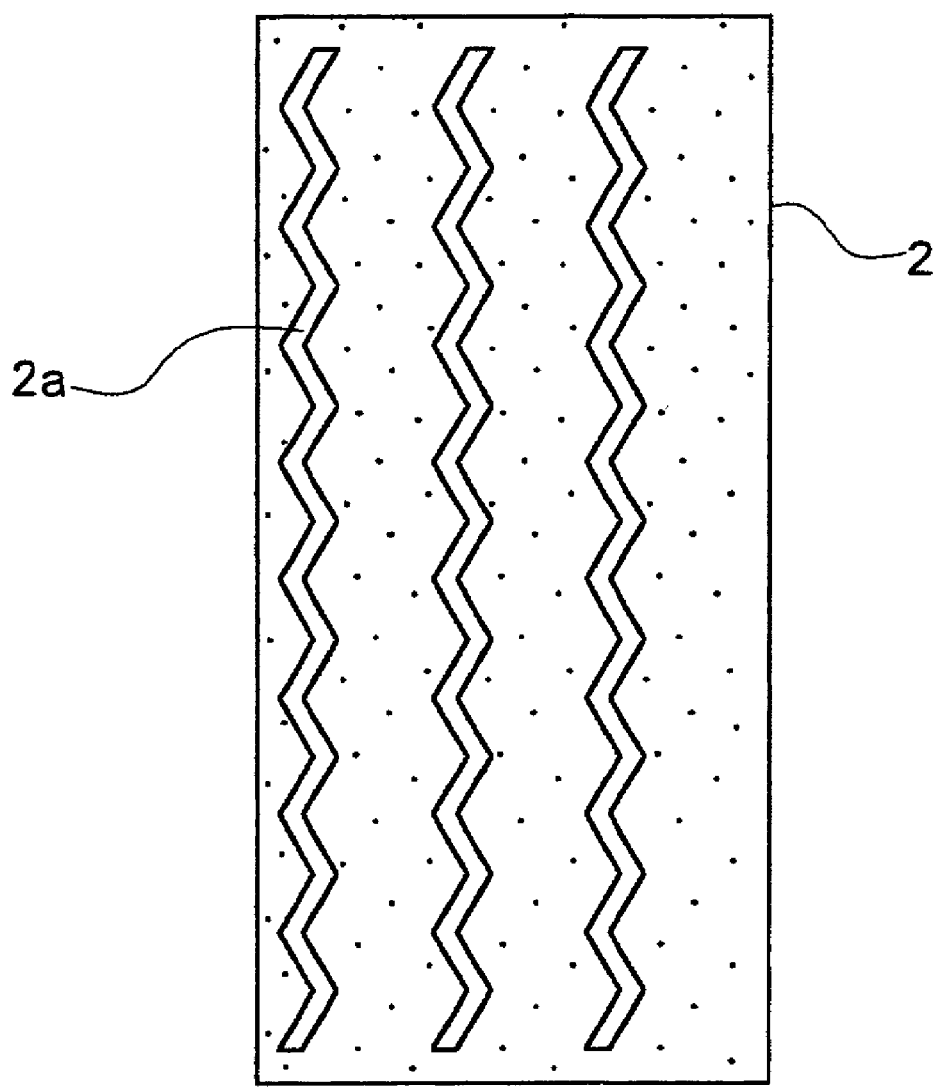
FIG. 5 is a top view of a mask of another embodiment.
Figure 6:
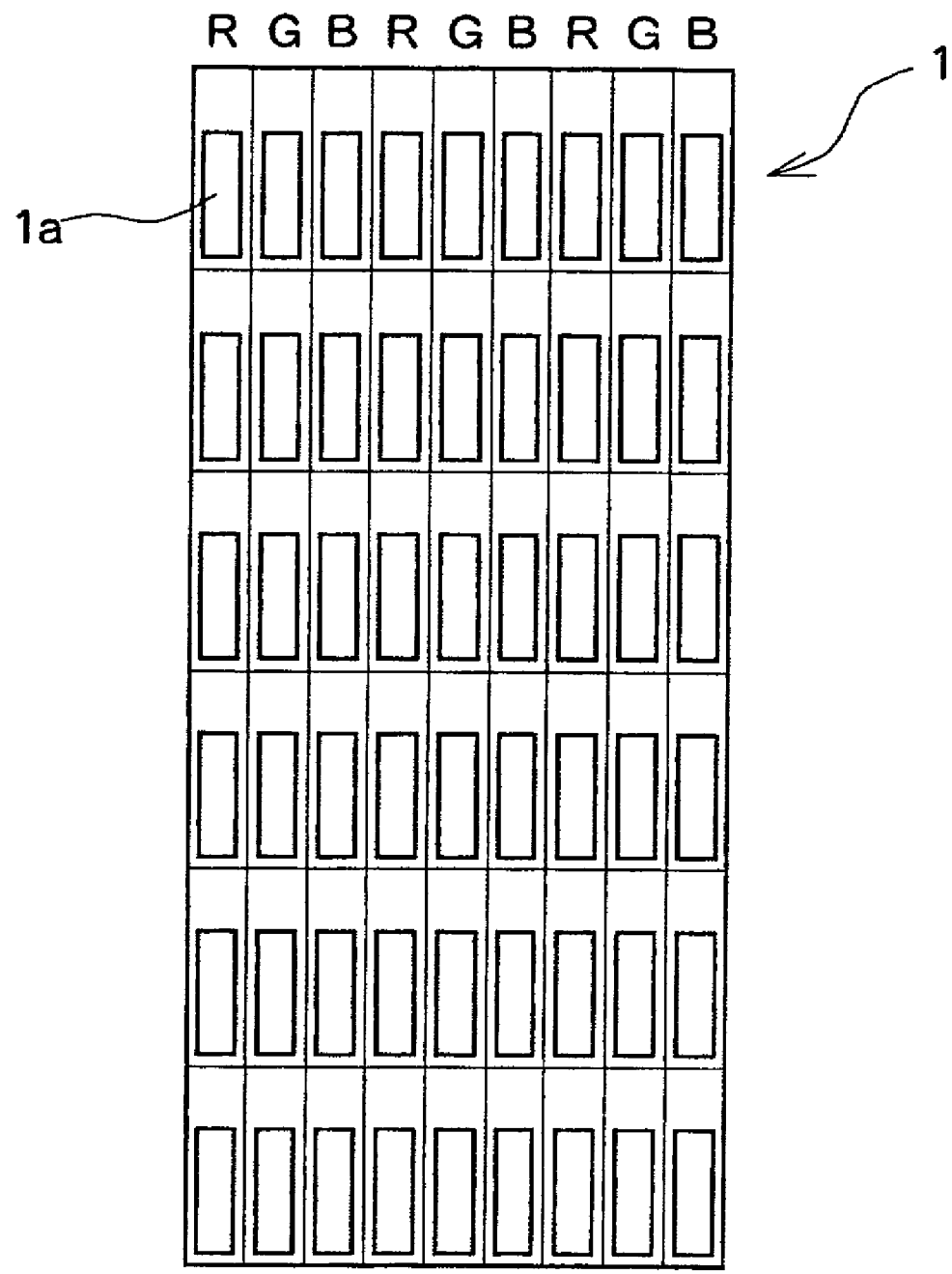
FIG. 6 illustrates a pixel arrangement.

For example, the present embodiment was described for the case where pixels of the same color are linearly arranged along a column. However, the invention can also be applied for the case where pixels of the same color are arranged in a zigzag manner along a column, such as in a delta arrangement. FIG. 5 shows the mask 2 for this case. Corresponding to the arrangement of pixels of the same color, the openings 2a are also formed in a zigzag shape along the column. Using this mask 2 enables the organic emissive layer 63 to be in common among the pixels of the same color in adjacency in a zigzag manner and the film thickness of the organic emissive layer 63 to be uniform on the anode 61.

Furthermore, although the present embodiment was described for the case in which the organic emissive layer 63 is formed by vapor deposition, the organic emissive layer 63 can also be formed in common by an ink jet method in a similar fashion using the mask 2 (which functions as a frame for limiting the region for dripping ink) shown in FIG. 1.

Furthermore, when forming multiple printed panels simultaneously on one large substrate, the mask 2 shown in FIG. 1 can be used for each panel.

While there has been described what are at present considered to be preferred embodiments of the invention, it will be understood that various modifications may be made thereto, and it is intended that the appended claims cover all such modifications as fall within the true spirit and scope of the invention.

The present embodiment was described for the case in which the organic emissive layer 63 was formed using a mask. However, the hole transport layer 62, the organic emissive layer 63, and the electron transport layer 64 forming the organic layer 65 can also all be formed using the same mask. The present invention is also applicable in this case. Namely, by having the mask for forming the hole transport layer 62 in common with adjacent pixels, the hole transport layer 62 is in common with adjacent pixels of the same color. Then, as described above, by having the mask for forming the emissive layer 63 in common with adjacent pixels, the emissive layer 63 is in common with adjacent pixels of the same color. Furthermore, similarly for the electron transport layer 64, by having the mask for forming the electron transport layer 64 in common with adjacent pixels, the electron transport layer 64 can be made in common with adjacent pixels of the same color. Besides having the hole transport layer 62, the organic emissive layer 63, and the electron transport layer 64 all in common with adjacent pixels of the same color, the hole transport layer 62 and the organic emissive layer 63 can be in common with adjacent pixels of the same color with the electron transport layer 64 formed at each pixel, or the hole transport layer 62 can be formed at each pixel with the organic emissive layer 63 and the electron transport layer 64 in common with adjacent pixels of the same color.

What is claimed is:

1. A light-emitting device having a pixel disposed in a matrix and an individual electrode independent for each pixel, comprising:
    a first electrode;
    a second electrode; and
    an organic electroluminescence emissive layer formed between said first electrode and said second electrode, said organic electroluminescence emissive layer is formed using a zigzag-shaped-mask;
    wherein at least either said first electrode or said second electrode is formed individually and separately for said each pixel and said emissive layer is in common with a plurality of pixels in adjacency in said matrix, said pixel is a color pixel, and said plurality of pixels of same color is disposed in a zigzag pattern in a column direction.

2. A light-emitting device according to claim 1 wherein said pixel comprises an R pixel, a G pixel, and a B pixel, and said emissive layer is in common with adjacent R pixels, or G pixels, or B pixels.

3. A light-emitting device according to claim 1, wherein said first electrode is formed at each of said pixels, and said second electrode is formed in common with said pixels.

4. A light-emitting device according to claim 1 wherein pixels of same color are arranged in a delta arrangement.

5. A light-emitting device having a color pixel disposed in a matrix and an individual electrode independent for each pixel, comprising:
    a first electrode;
    a second electrode; and
    an emissive layer formed between said first electrode and said second electrode, said emissive layer is formed using a zigzag-shaped-mask;
    wherein at least either said first electrode or said second electrode is formed individually and separately for said each pixel and said emissive layer is integrally formed with a plurality of pixels of same color in adjacency in said matrix and wherein said plurality of pixels of same color is disposed in a zigzag pattern in a column direction.

6. A light-emitting device having a color pixel disposed in a matrix and an individual electrode independent for each pixel, comprising:
- a first electrode;
- a second electrode; and
- a hole transport layer, an organic electroluminescence emissive layer, and an electron transport layer formed between said first electrode and said second electrode;
- wherein at least either said first electrode or said second electrode is formed individually and separately for said each pixel;
- said emissive layer is in common with a plurality of pixels in adjacency in said matrix, said plurality of pixels of same color is disposed in a zigzag pattern in a column direction;
- said emissive layer is formed using a zigzag-shaped-mask; and
- at least either said hole transport layer or said electron transport layer is in common with a plurality of pixels in adjacency in said matrix.

7. A light-emitting device according to claim 6 wherein:
- at least either said hole transport layer or said electron transport layer is in common with a plurality of pixels of same color in adjacency.

8. A light-emitting device having pixels disposed in a matrix and an individual electrode independent for each pixel, comprising:
- a first electrode;
- a second electrode; and
- an organic electroluminescence emissive layer formed between said first electrode and said second electrode,
- wherein at least either said first electrode or said second electrode is formed individually and separately for said each pixel, and
- said emissive layer is in common with a plurality of pixels in adjacency of same color formed in a zigzag arrangement in a column direction in said matrix by forming said emissive layer by vacuum evaporation using a mask having zigzag shaped opening.

9. A light-emitting device having pixels disposed in a matrix and an individual electrode independent for each pixel, comprising:
- a first electrode;
- a second electrode; and
- a hole transport layer, an organic electroluminescence emissive layer, and an electron transport layer formed between said first electrode and said second electrode,
- wherein at least either said first electrode or said second electrode is formed individually and separately for said each pixel,
- said emissive layer is in common with a plurality of pixels in adjacency of same color formed in a zigzag arrangement along in a column direction in said matrix by forming said emissive layer by vacuum evaporation using a mask having zigzag shaped opening, and
- at least either said hole transport layer or said electron transport layer is in common with a plurality of pixels in adjacency in said matrix.

* * * * *